United States Patent
Huang et al.

(10) Patent No.: US 9,054,669 B2
(45) Date of Patent: Jun. 9, 2015

(54) ELECTRONIC DEVICE FOR ELIMINATING WIRELESS NOISE INTERFERENCE

(71) Applicant: MediaTek Inc., Hsin-Chu (TW)

(72) Inventors: Hsiao-Ting Huang, Taichung (TW); Cheng-Hao Kuo, Ji'an Township, Hualien County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/256,148

(22) Filed: Apr. 18, 2014

(65) Prior Publication Data
US 2015/0022278 A1    Jan. 22, 2015

Related U.S. Application Data

(60) Provisional application No. 61/847,149, filed on Jul. 17, 2013.

(51) Int. Cl.
*H04B 3/28*    (2006.01)
*H03H 7/01*    (2006.01)

(52) U.S. Cl.
CPC .................. *H03H 7/0138* (2013.01)

(58) Field of Classification Search
CPC .................. H04B 1/0475; H04B 1/10
USPC ............... 333/12, 245, 246, 247
See application file for complete search history.

(56) References Cited

U.S. PATENT DOCUMENTS

| | | | | |
|---|---|---|---|---|
| 5,686,871 A | * | 11/1997 | Baran | 333/12 |
| 6,956,444 B2 | * | 10/2005 | Miller | 333/12 |
| 8,542,075 B2 | * | 9/2013 | Wu et al. | 333/12 |
| 8,659,365 B2 | * | 2/2014 | Wu et al. | 333/12 |

* cited by examiner

*Primary Examiner* — Jeffrey Zweizig
(74) *Attorney, Agent, or Firm* — McClure, Qualey & Rodack, LLP

(57) ABSTRACT

In an embodiment of the disclosure, an electronic device arranged for eliminating wireless noise interference is provided. The electronic device includes a circuit board and two first metal components. The metal components are arranged on different sides of the circuit board. Each of the first metal components comprises a first terminal and a second terminal opposite to the first terminal. The first terminal is coupled to the circuit board and the second terminal is open loop. The length of the first metal component is about one-fourth wavelength of a pre-determined frequency.

25 Claims, 9 Drawing Sheets

ELECTRONIC DEVICE FOR ELIMINATING WIRELESS NOISE INTERFERENCE

CROSS REFERENCE TO RELATED APPLICATIONS

This application claims the benefit of U.S. Provisional Application No. 61/847,149, filed on Jul. 17, 2013, the entirety of which is/are incorporated by reference herein.

BACKGROUND OF THE INVENTION

1. Field of the Invention

The present invention relates to an electronic device for eliminating wireless noise interference, and in particular to an electronic device for eliminating wireless noise interference by adding some metal components on the ground layer.

2. Description of the Related Art

When a wireless internet card is used to transmit a wireless signal to a host electronic device through a high-speed signal interface, some noise currents are generated from the signal port of the high-speed signal interface due to the discontinuity of the transmitting path or the poor quality of the transmitted wireless signal. Furthermore, such noise currents radiate to the air and result in wireless noise interference deteriorating the transmission efficiency of the wireless signal. Therefore, an electronic device is needed to reduce or eliminate the wireless noise interference.

BRIEF SUMMARY OF THE INVENTION

In an embodiment of the disclosure, an electronic device arranged for eliminating wireless noise interference is provided. The electronic device includes a circuit board and two first metal components. The metal components are arranged on different sides of the circuit board. Each of the first metal components comprises a first terminal and a second terminal opposite to the first terminal. The first terminal is coupled to the circuit board and the second terminal is open loop. The length of the first metal component is about one-fourth wavelength of a pre-determined frequency.

In another embodiment of the disclosure, an electronic device arranged for eliminating wireless noise interference is provided. The electronic device includes a circuit board and a metal strip. The metal strip includes two margin areas and a central area arranged between the two margin areas. The central area is in contact with the circuit board, and a length of each of the two margin areas is about one-fourth wavelength of a pre-determined frequency.

In another embodiment of the disclosure, an electronic device arranged for eliminating wireless noise interference is provided. The electronic device includes a circuit board, a signal port and at least one metal component. The circuit board includes a substrate layer and a ground layer covering the substrate layer. The signal port is arranged on the circuit board. The at least one metal component includes a first terminal and a second terminal opposite to the first terminal. The first terminal is in contact with the substrate layer and the second terminal is open loop.

A detailed description is given in the following embodiments with reference to the accompanying drawings.

BRIEF DESCRIPTION OF THE DRAWINGS

For a more complete understanding of the illustrative embodiments and the advantages thereof, reference is now made to the following descriptions taken in conjunction with the accompanying drawings

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims. The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Figure 1A:
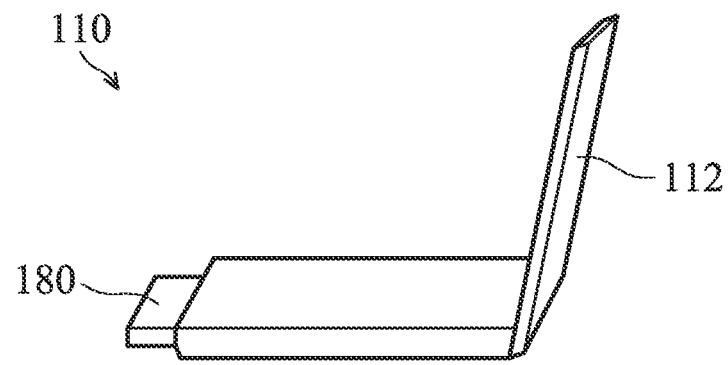
FIGS. 1A and 1B are diagrams of the wireless internet card in accordance with some embodiments.
Figure 1B:
Figure 1C:
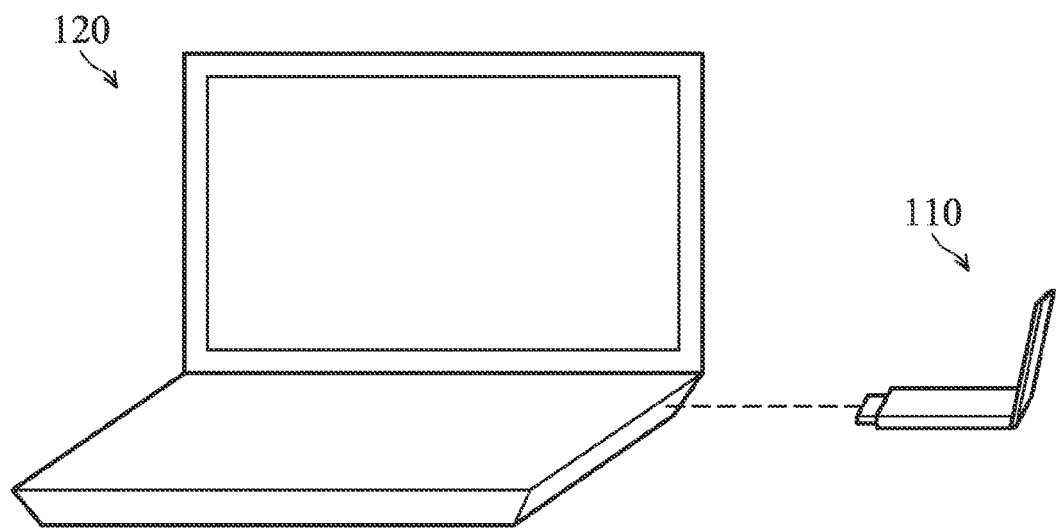
FIG. 1C is a diagram showing the wireless internet card and the host electronic device.
Figure 1D:
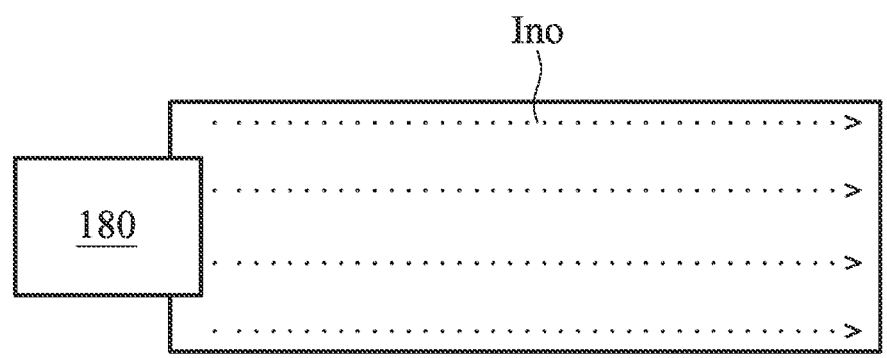
FIG. 1D is a diagram showing the noise currents flowing on the wireless internet card.

FIGS. 1A and 1B are diagrams of the wireless internet card 110 in accordance with some embodiments. As shown in FIG. 1A, the wireless internet card 110 includes a signal port 180, a circuit board (not shown) and an antenna 112 arranged outside the circuit board. For example, the circuit board is a PCB (Printed Circuit Board). In other embodiments, as shown in the FIG. 1B, the antenna 112 is arranged on the circuit board instead of outside the circuit board. FIG. 1C is a diagram showing the wireless internet card 110 and the host electronic device 120. When the wireless internet card 110 is utilized, the wireless signal will be radiated from the wireless internet AP (Access Point) and transmitted to the wireless internet card 110. Afterwards, the wireless signal is transmitted to the host electronic device 120 through a high-speed signal interface (such as USB 3.0, PCIE Gen 2, and SDIO 3.0) of the wireless internet card 110. However, as shown in FIG. 1D, when the high-speed signal interface is transmitting the wireless signal, it will generate noise currents Ino radiating to the air. Such noise currents Ino will result in wireless noise interference of the adjacent wireless network (especially in the frequency of about 2.4 GHz or 5 GHz) and affect the transmission efficiency of the wireless signal.

Figure 2A:
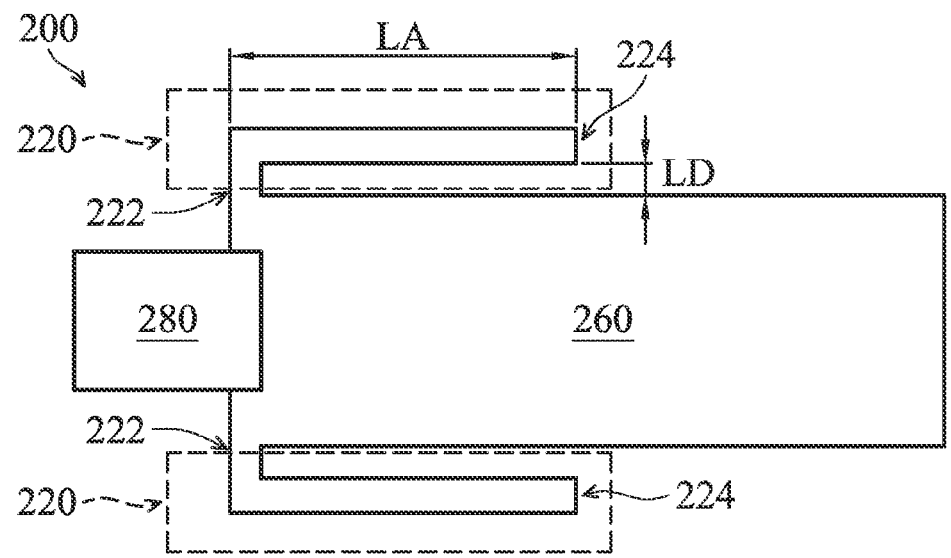
FIG. 2A is a diagram of the electronic device for eliminating wireless noise interference in accordance with some embodiments.

FIG. 2A is a diagram of the electronic device 200 for eliminating wireless noise interference in accordance with some embodiments. For example, the electronic device 200 could be embedded within the wireless internet card 110 or the high-speed signal interface. In another example, some components of the wireless internet card 110 or the high-speed signal interface could be arranged or manufactured in accordance with the electronic device 200. As shown in FIG. 2A, the electronic device 200 includes two first metal components 220, a circuit board 260 and a signal port 280. In some embodiments, two first metal components 220 are arranged on different sides of the circuit board 260. Specifically, the circuit board 260 is a rectangular shape and the two first metal components 220 are placed on the two long sides of the circuit board 260.

In addition, each of the first metal components 220 includes a first terminal 222 and a second terminal 224 opposite to the first terminal 222. The first terminal 222 is coupled to or electrically connected to the circuit board 260, and the second terminal 224 is open loop. In other words, the first metal component 220 and the circuit board 260 are connected to each other at the location of the first terminal 222. The second terminal 224 remains open without touching or connecting any electrical components or layers. As shown in FIG. 2A, in some embodiments, the length LA of the first metal component 220 is about one-fourth wavelength of a pre-determined frequency. For example, the pre-determined frequency is about 2.4 GHz or 5 GHz. In other embodiments, the distance LD between the first metal component 220 and the circuit board 260 is around 1 mm to 2 mm (or 0.005 to 0.05 wavelength). In addition, the signal port 280 is arranged between the two first terminals 222 of the two first metal components 220.

Figure 2B:
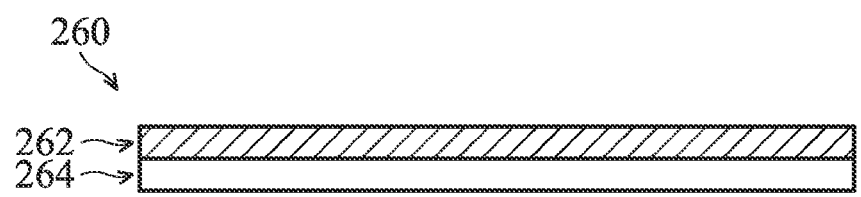
FIG. 2B is a diagram of the circuit board of the electronic device in accordance with some embodiments.
Figure 2C:
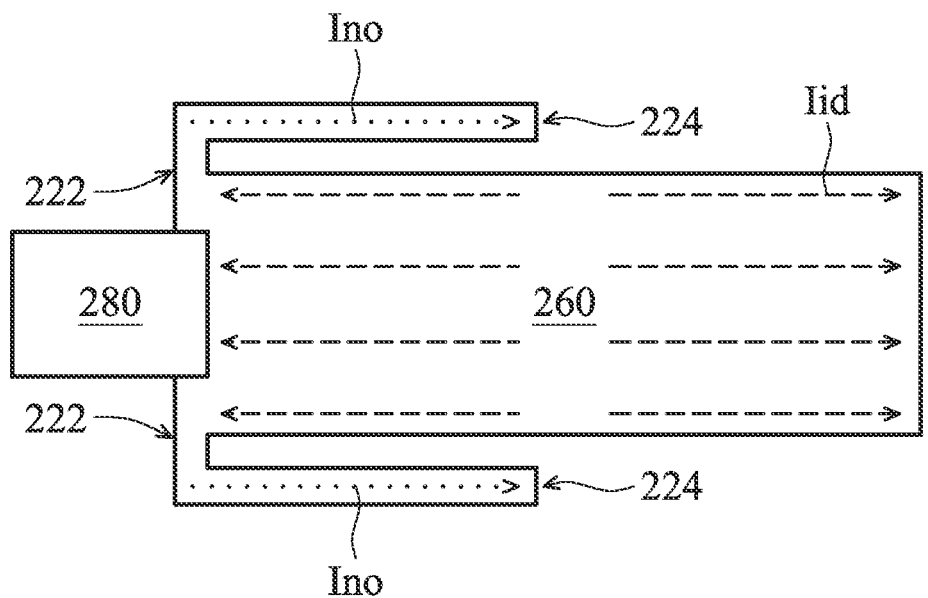
FIG. 2C is a diagram showing the noise currents and the induced currents flowing on the wireless internet card.

FIG. 2B is a diagram of the circuit board 260 of the electronic device 200 in accordance with some embodiments. The circuit board 260 includes a substrate layer 264 and a ground layer 262 covering the substrate layer 264. For example, the material of the ground layer is copper. In some embodiments, the first terminal 222 is connected to or in contact with the ground layer 262 of the circuit board 260. Therefore, the first metal component 220 with the first terminal 222 connecting to the ground layer 262 and the second terminal 224 remaining open is also called an open stub. FIG. 2C is a diagram showing the noise currents Ino and the induced currents Iid flowing on the circuit board 260. Because the first metal component 220 is an open stub with a length of one-fourth wavelength of a pre-determined frequency, noise currents Ino are generated along the first metal component 220. Specifically, the noise currents Ino flow from the first terminal 222 of low resistance to the second terminal 224 of high resistance. Afterwards, an induced current Iid is generated or induced at the circuit board 260 in accordance with the noise currents Ino. Because the flowing direction of the induced current Iid is opposite to or adverse to the flowing direction of the noise current Ino, the wireless noise interference are reduced or improved at such regions where an induced current Iid is generated or induced.

Figure 2D:
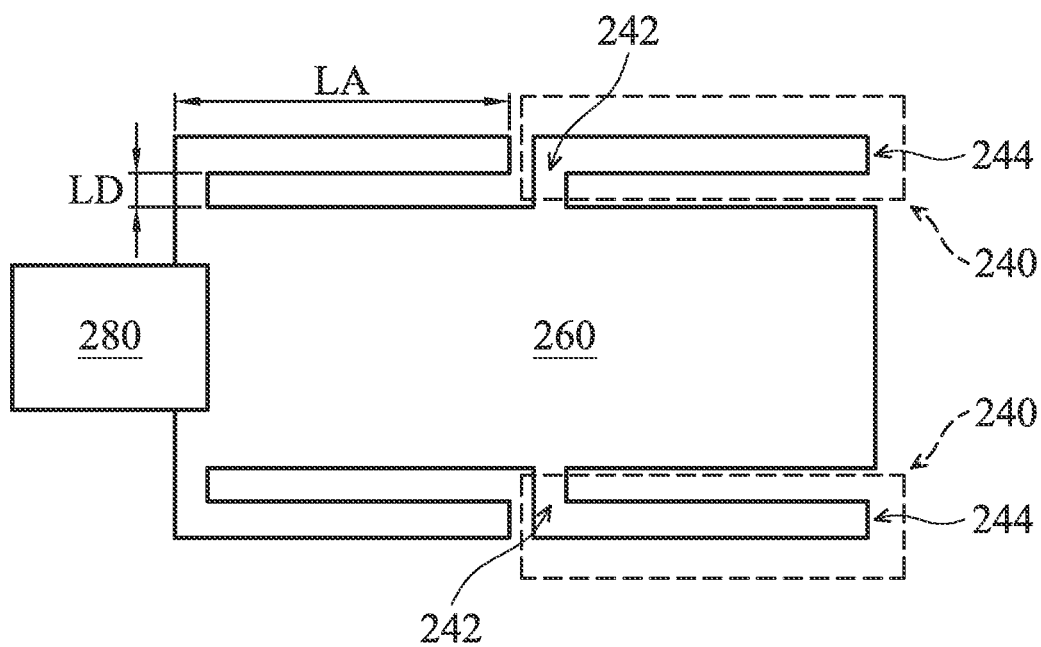
FIG. 2D is another diagram of the electronic device for eliminating wireless noise interference in accordance with some embodiments.

FIG. 2D is another diagram of the electronic device for eliminating wireless noise interference in accordance with some embodiments. In some embodiments, two second metal components 240 are arranged on different sides of the circuit board 260. As shown in FIG. 2D, the first terminals 242 of the second metal components 240 are adjacent to the second terminals 224 of the first metal components 220. It should be noted that the second metal component 240 is identical to the first metal component 220. In other words, the first terminal 242 is connected to the ground layer 262, the second terminal 244 is an open loop, and the length of the second metal component 240 is about one-fourth wavelength of a pre-determined frequency. Since the two second metal components 240 are arranged on another region of the circuit board 260, the wireless noise interference is reduced or improved at such regions where the flowing direction of the noise current is reversed or changed by the second metal components 240. Therefore, compared to the embodiment shown in FIG. 2A with two first metal components 220, the embodiment shown in FIG. 2D with two first metal components 220 and two second metal components 240 improves the wireless noise interference more efficiently.

Figure 3A:
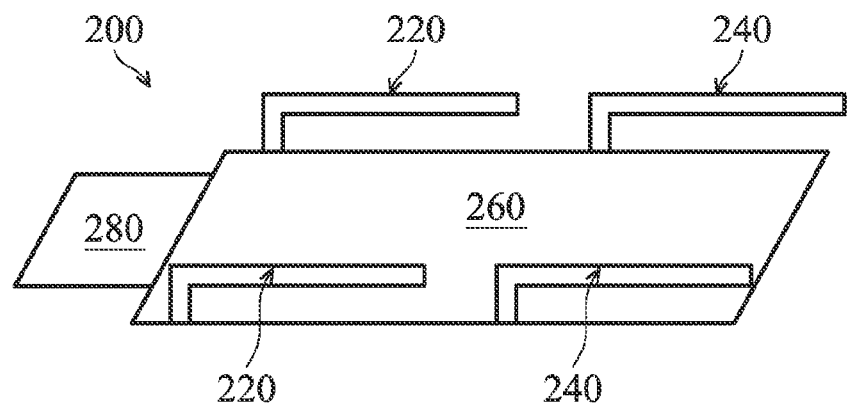
FIGS. 3A, 3B, 3C, 3D, 3E and 3F are other diagram of the electronic devices for eliminating wireless noise interference in accordance with some embodiments.
Figure 3B:
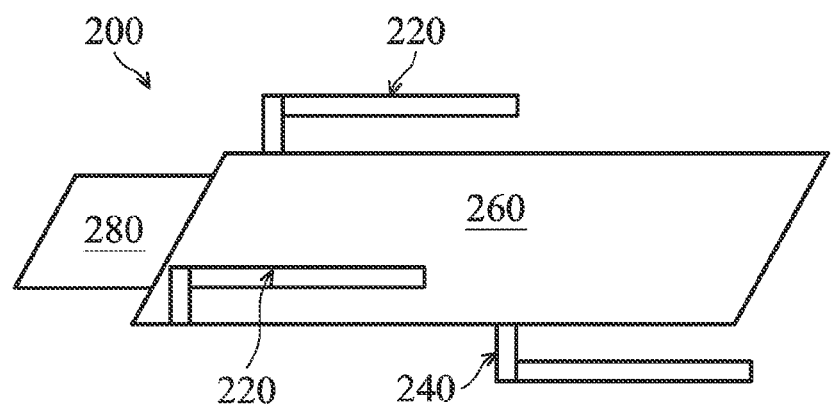

Regarding the shape or arrangement of the metal components, the two first metal components 220 of the embodiment shown in FIG. 2A are arranged on the same plane of the circuit board 260. Similarly, the two first metal components 220 and two second metal components 240 of the embodiment shown in FIG. 2D are arranged on the same plane of the circuit board 260. FIGS. 3A, 3B, 3C, 3D, 3E and 3F are other diagrams of the electronic devices 220 for eliminating wireless noise interference in accordance with some embodiments. In some embodiments, as shown in FIG. 3A, two first metal components 220 and two second metal components 240 are arranged on the same side of the circuit board 260 but on the plane different from the circuit board 260. In other words, the two first metal components 220 and two second metal components 240 are upright or vertical to the circuit board 260, and the electrical device 200 as shown in FIG. 3A is a stereoscopic or three-dimensional structure. FIG. 3B is another diagram of the electronic device 200 for eliminating wireless noise interference in accordance with some embodiments. In these embodiments, the two first metal components 220 and two second metal components 240 are arranged on different sides of the circuit board 260 respectively. For example, the two first metal components 220 are arranged above the circuit board 260, and the two second metal components 240 are arranged under the circuit board 260.

Figure 3C:
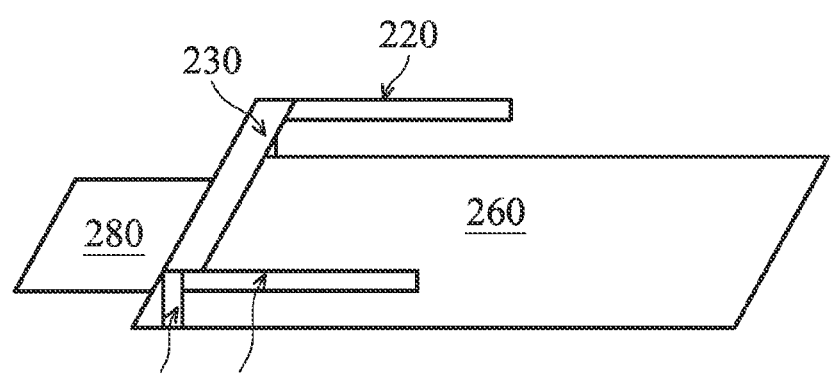
Figure 3D:
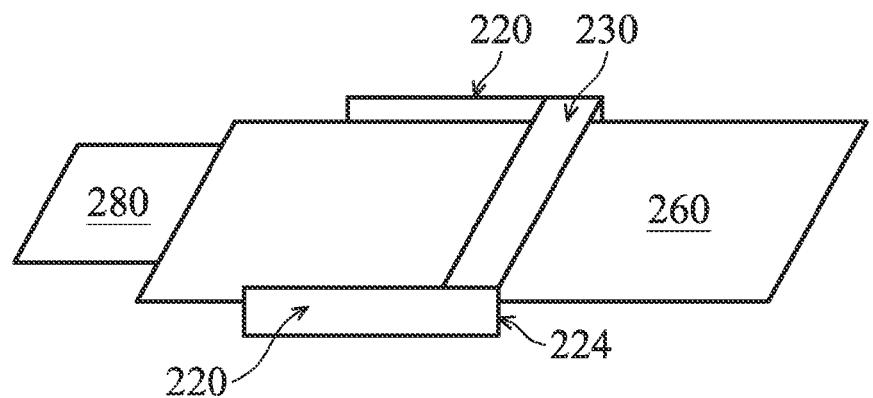

FIG. 3C is another diagram of the electronic device 200 for eliminating wireless noise interference in accordance with some embodiments. In these embodiments, two first metal components 220 are connected by a connecting metal component 230. As shown in FIG. 3C, the positions where the connecting metal component 230 connects to the two first metal components 220 are close to first terminals 222. Therefore, the first metal components 220, the connecting metal component 230 and second metal components 240 are upright to the circuit board 260, and the electrical device 200 as shown in FIG. 3C is a stereoscopic or three-dimensional structure. FIG. 3D is another diagram of the electronic device 200 for eliminating wireless noise interference in accordance with some embodiments. In these embodiments, two first metal components 220 are connected by the connecting metal component 230, and the positions where the connecting metal component 230 connects to the two first metal components 220 are close to second terminals 224. In addition, the electrical device 200 as shown in FIG. 3D is also a stereoscopic or three-dimensional structure.

Figure 3E:
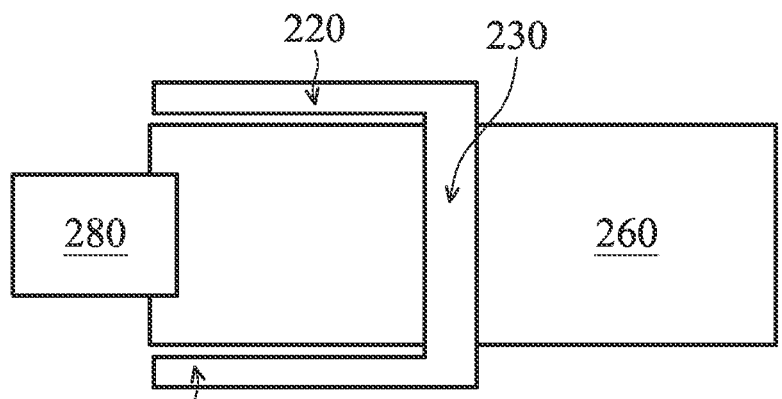
Figure 3F:
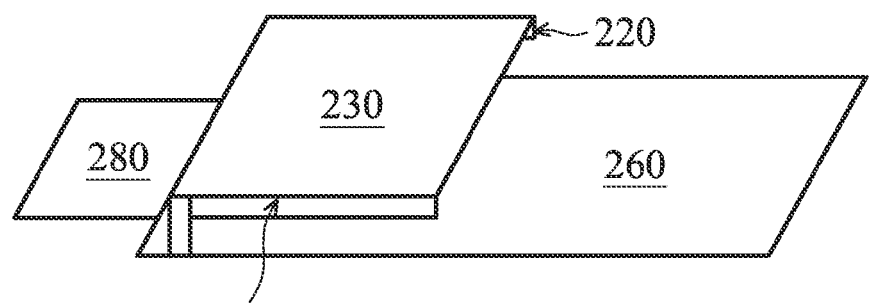

FIG. 3E is another diagram of the electronic device 200 for eliminating wireless noise interference in accordance with some embodiments. In these embodiments, two first metal components 220 are connected by the connecting metal component 230, and the positions where the connecting metal component 230 connects to the two first metal components 220 are close to second terminals 224. However, it should be noted that the two first metal components 220 and the connecting metal component 230 form a planar structure across the circuit board 260. In other embodiments, the two first metal components 220 and the connecting metal component 230 form a metal strip to touch or cover the circuit board 260. FIG. 3F is another diagram of the electronic device 200 for eliminating wireless noise interference in accordance with some embodiments. In these embodiments, two first metal components 220 are connected by the connecting metal component 230. However, the length of the connecting metal component 230 is the same as the length of the first metal component 220, which means that the connecting metal component 230 is in contact with the whole first metal component 220.

Figure 4A:
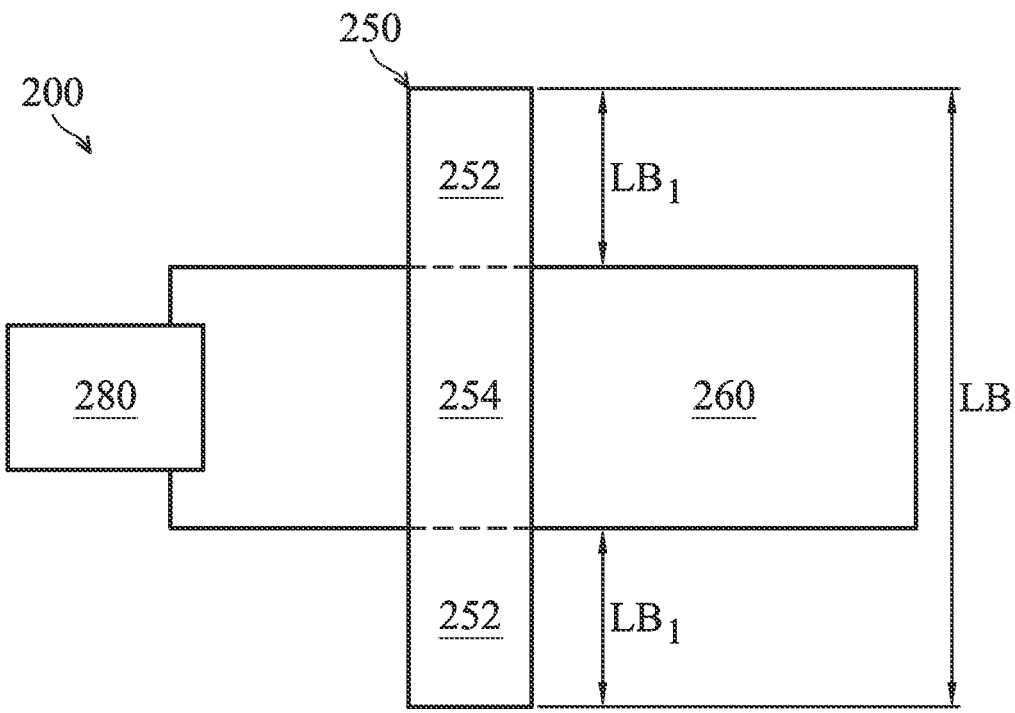
FIG. 4A is a diagram of the electronic device for eliminating wireless noise interference in accordance with some embodiments.

FIG. 4A is a diagram of the electronic device 200 for eliminating wireless noise interference in accordance with some embodiments. The electronic device 200 includes a metal strip 250, a circuit board 260 and a signal port 280. In some embodiments, the metal strip 250 includes two margin areas 252 and a central area 254 arranged between the two margin areas 252. In other embodiments, the two margin areas 252 could also be the metal components 220, and the central area 254 could be the connecting component 230. As shown in FIG. 4A, the central area 254 is covering above or in contact with the circuit board 260. In addition, the length $LB_1$ of each of the two margin areas 252 is about one-fourth wavelength of a pre-determined frequency. Therefore, the total length LB of the metal strip 250 is longer than half of the wavelength of the pre-determined frequency. For example, the pre-determined frequency is about 2.4 GHz or 5 GHz.

Figure 4B:
FIG. 4B is a diagram of the metal strip of the electronic device in accordance with some embodiments.

In other embodiments, the central area 254 is in contact with a central portion of the circuit board 260 and near the signal port 280. In other embodiments, the circuit board 260 includes a substrate layer and a ground layer covering the substrate layer, and the central area 254 is connecting or in contact with the ground layer. FIG. 4B is a diagram of the metal strip 250 of the electronic device 200 in accordance with some embodiments. The metal strip 250 includes a metal layer 250a and an insulator layer 250b. In some embodiments, the insulator layer 250b of the metal strip 250 is in contact with the ground layer of the circuit board 260, therefore, the metal layer 252 is not short to the circuit board 260. In other embodiments, the metal layer 250a of the metal strip 250 is in contact with the ground layer of the circuit board 260, therefore, the metal layer 252 is short to the circuit board 260.

Figure 4C:
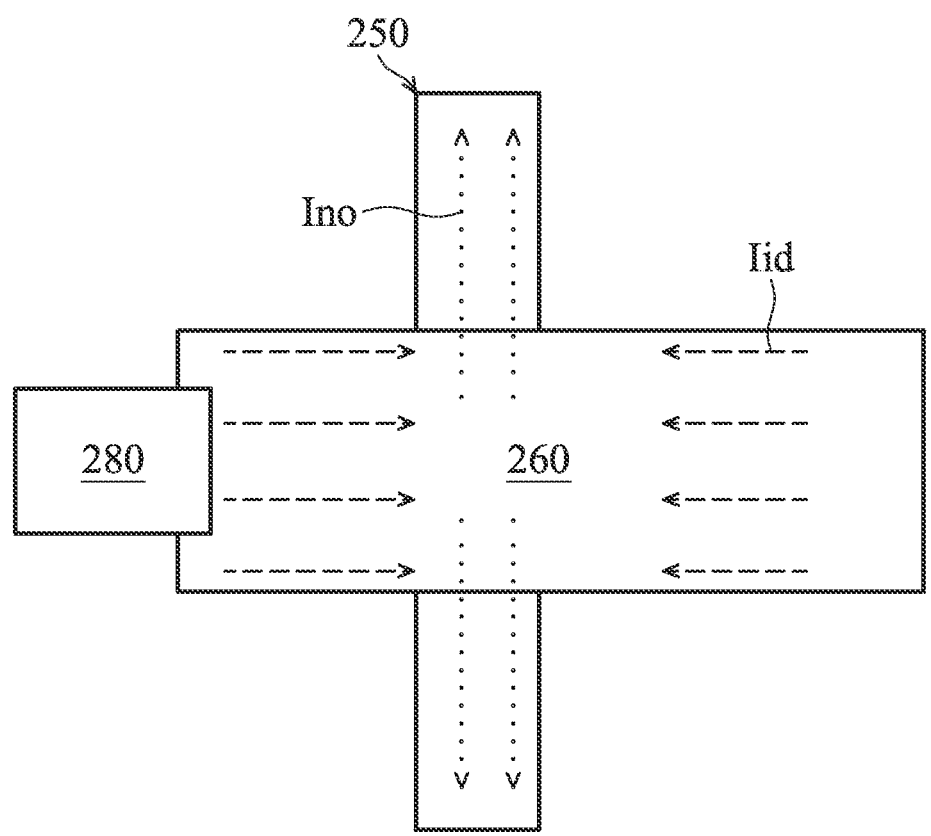
FIG. 4C is another diagram of the electronic device for eliminating wireless noise interference in accordance with some embodiments.

FIG. 4C is another diagram of the electronic device 200 for eliminating wireless noise interference in accordance with some embodiments. In these embodiments, the metal strip 250 is under the circuit board 260 but the central area 254 is still in contact with the circuit board 260. No matter whether the metal strip 250 is placed under or above the circuit board 260; in such embodiments, the noise currents Ino are generated along the metal strip 250 and the induced currents Iid are induced in accordance with the noise currents Ino. As shown in FIG. 4C, the flowing directions of the induced currents Iids at the circuit board 260 are opposite to each other. Therefore, the wireless noise interference is reduced or improved.

In addition, Table 1 illustrates the sensitivity of two samples of various arrangements with the proposed method of the invention and without the proposed method of the invention.

TABLE 1

| Sensitivity (dBm) | Sample one | Sample two |
| --- | --- | --- |
| Cable Mode | −73.5 | −73 |
| Wireless Mode one (original) | −64 | −63 |
| Wireless Mode two (with proposed metal component) | −69 | −69 |
| Wireless Mode three (with proposed metal strip) | −70.3 | −70.9 |

In the cable mode as shown in Table 1, the samples one and two are directly connected to the testing apparatus through cables or wires. On the other hand, at the wireless mode, the samples one and two wirelessly receive the signal from the testing apparatus without cables or wires. Therefore, the sensitivity value measured at the cable mode could be regarded as the standard value or theoretical value. The less difference is measured between the sensitivity values of the cable mode and the wireless mode, the less noise interference is caused during the wireless signal transmission.

As shown in Table 1, the sensitivities of the samples one and two at the cable mode are −73.5 dBm and −73 dBm. At the wireless mode one without the arrangements provided by the present invention, the sensitivities of the samples one and two at the wireless mode one are −64 dBm and −63 dBm, which means the sensitivities are degraded by 9 dBm and 10 dBm respectively. In some embodiments, when the proposed metal components 220 are applied, the sensitivities of the samples one and two at the wireless mode two are both −69 dBm, which means the sensitivities are improved by 5 dBm and 6 dBm respectively compared to the wireless mode one. In other embodiments, when the proposed metal strips 250 are applied, the sensitivities of the samples one and two at the wireless mode two are −70.3 dBm and −70.9 dBm, which means the sensitivities are improved by 6.3 dBm and 7.9 dBm respectively compared to the wireless mode one. Therefore, with the arrangement of the metal components 220 or the metal strip 250, the wireless noise interference could be reduced or improved.

Figure 5A:
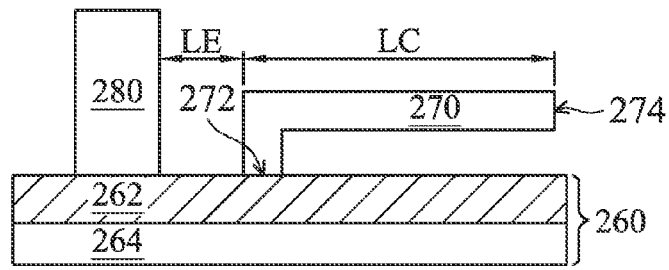
FIGS. 5A, 5B and 5C are other diagrams of the electronic devices for eliminating wireless noise interference in accordance with some embodiments.
Figure 5B:
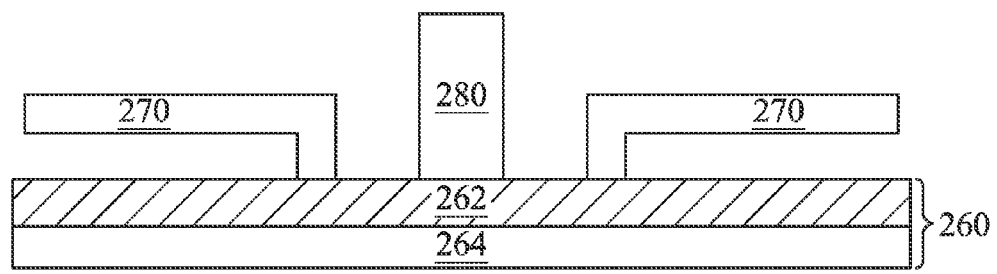
Figure 5C:
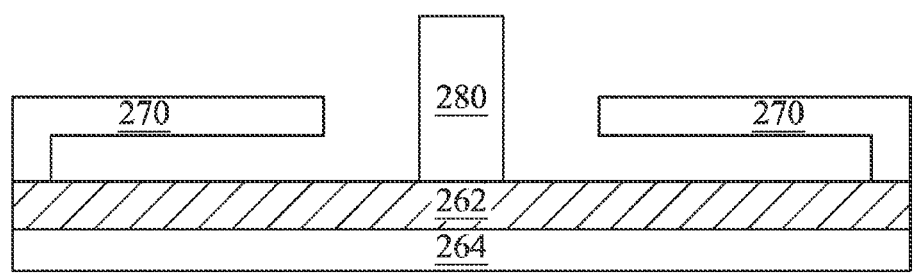

FIGS. 5A, 5B and 5C are other diagrams of the electronic devices 200 for eliminating wireless noise interference in accordance with some embodiments. As shown in FIG. 5A, the circuit board 260 includes the substrate layer 264 and the ground layer 262 covering the substrate layer 264. The signal port 280 is arranged on the ground layer 262. In addition, one metal component 270 includes a first terminal 272 and a second terminal 274 opposite to the first terminal 272. The first terminal 272 is in contact with the ground layer 262 and the second terminal 274 is open loop. Therefore, the metal component 270 with the first terminal 272 connecting to the ground layer 262 and the second terminal 224 remaining open is also called an open slot. In some embodiments, the length LC of the metal component 270 is:

$$\frac{2n-1}{4} \times \lambda,$$

Specifically, n is a positive integer and λ is a wavelength of a pre-determined frequency. For example, the pre-determined frequency is about 2.4 GHz or 5 GHz.

It should be noted that in these embodiments, the signal port 280 is an upright or vertical component, which means that the plane along the long side of the signal port 280 is vertical to the plane of the circuit board 260. Besides, the distance LE between the first terminal 272 and the signal port 280 is smaller than one-fourth of 2. For example, the distance LE is near but not zero. In other embodiments, as shown in FIG. 5B, two metal components 270 are arranged on different sides of the signal port 280, and the signal port 280 is arranged between the two metal components 270. In other embodiments, two metal components 270 are arranged on different sides of the signal port 280 as shown in FIG. 5C, but the positions and directions of the two metal components 270 are different from the arrangements of FIG. 5B. In other embodiments, the metal component 270 could be a meander structure.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An electronic device, arranged for eliminating wireless noise interference, comprising:
 a circuit board; and
 two first metal components arranged on different sides of the circuit board, wherein each of the first metal components comprises a first terminal and a second terminal opposite to the first terminal, the first terminal is coupled to the circuit board and the second terminal is open loop, and a length of the first metal component is about one-fourth wavelength of a pre-determined frequency.

2. The electronic device as claimed in claim 1, wherein the pre-determined frequency is about 2.4 GHz or 5 GHz.

3. The electronic device as claimed in claim 1, wherein the circuit board comprises a substrate layer and a ground layer covering the substrate layer, and the first terminal is connected to the ground layer.

4. The electronic device as claimed in claim 1, wherein the electronic device further comprises a signal port arranged on the circuit board, and the signal port is arranged between the first terminals of the two first metal components.

5. The electronic device as claimed in claim 4, wherein the two first metal components are connected by a connecting metal component.

6. The electronic device as claimed in claim 5, wherein the two first metal components and the connecting metal component form a planar structure across the circuit board.

7. The electronic device as claimed in claim 5, wherein the two first metal components and the connecting metal component form a stereoscopic structure across the circuit board.

8. The electronic device as claimed in claim 4, wherein the electronic device further comprises two second metal components identical to the first metal components, and the second metal components are arranged on different sides of the circuit board, and the first terminals of the second metal components are adjacent to the second terminals of the first metal components.

9. The electronic device as claimed in claim 8, wherein the circuit board comprises a top side and a bottom side which is opposite to the top side, and the first metal components and the second metal components are arranged on the top side of the circuit board.

10. The electronic device as claimed in claim 9, wherein the first metal components and the second metal components are vertical to the circuit board.

11. The electronic device as claimed in claim 8, wherein the circuit board comprises a top side and a bottom side which is opposite to the top side, and the first metal components and the second metal components are arranged on the top side and the bottom side of the circuit board respectively.

12. The electronic device as claimed in claim 11, wherein the first metal components and the second metal components are vertical to the circuit board.

13. The electronic device as claimed in claim 1, wherein the distance between each of the first metal components and the circuit board is around 1 mm to 2 mm.

14. An electronic device, arranged for eliminating wireless noise interference, comprising:
 a circuit board; and
 a metal strip comprising two margin areas and a central area arranged between the two margin areas, wherein the central area is in contact with the circuit board, and a length of each of the two margin areas is about one-fourth wavelength of a pre-determined frequency.

15. The electronic device as claimed in claim 14, wherein the pre-determined frequency is about 2.4 GHz or 5 GHz.

16. The electronic device as claimed in claim 14, wherein the circuit board comprises a substrate layer and a ground layer covering the substrate layer, and the central area is in contact with the ground layer.

17. The electronic device as claimed in claim 14, wherein the electronic device further comprises a signal port arranged on the circuit board, and the central area is in contact with a central portion of the circuit board and near the signal port.

18. The electronic device as claimed in claim 16, wherein the metal strip comprises a metal layer and an insulator layer, and the insulator layer is in contact with the ground layer.

19. An electronic device, arranged for eliminating wireless noise interference, comprising:

a circuit board comprising a substrate layer and a ground layer covering the substrate layer;

a signal port arranged on the circuit board; and at least one metal component including a first terminal and a second terminal opposite to the first terminal, wherein the first terminal is in contact with the ground layer and the second terminal is open loop, wherein a length of the metal component is:

$$\frac{2n-1}{4} \times \lambda,$$

wherein n is a positive integer and $\lambda$ is a wavelength of a pre-determined frequency.

20. The electronic device as claimed in claim 19, wherein the pre-determined frequency is about 2.4 GHz or 5 GHz.

21. The electronic device as claimed in claim 19, wherein the distance between the first terminal and the signal port is smaller than one-fourth of $\lambda$.

22. The electronic device as claimed in claim 19, wherein the electronic device comprises two metal components arranged on different sides of the signal port, and the signal port is arranged between the two metal components.

23. The electronic device as claimed in claim 22, wherein the two metal components are vertical to the circuit board.

24. The electronic device as claimed in claim 19, wherein the metal component is a meander structure.

25. The electronic device as claimed in claim 19, wherein a long side of the signal port is vertical to the circuit board.

* * * * *